US 11,398,450 B2

(12) United States Patent
Kato et al.

(10) Patent No.: US 11,398,450 B2
(45) Date of Patent: Jul. 26, 2022

(54) SEMICONDUCTOR MODULE

(71) Applicant: FUJI ELECTRIC CO., LTD., Kawasaki (JP)

(72) Inventors: Ryoichi Kato, Kawasaki (JP); Yuma Murata, Kawasaki (JP); Naoyuki Kanai, Kawasaki (JP); Akito Nakagome, Kawasaki (JP); Yoshinari Ikeda, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/187,646

(22) Filed: Feb. 26, 2021

(65) Prior Publication Data

US 2021/0280556 A1  Sep. 9, 2021

(30) Foreign Application Priority Data

Mar. 6, 2020  (JP) .............................. JP2020-038367

(51) Int. Cl.
*H01L 25/07* (2006.01)
*H01L 23/00* (2006.01)
(Continued)

(52) U.S. Cl.
CPC ........ *H01L 24/48* (2013.01); *H01L 23/49844* (2013.01); *H01L 24/32* (2013.01);
(Continued)

(58) Field of Classification Search
CPC ..... H01L 24/32; H01L 23/5386; H01L 24/40; H01L 24/48; H01L 25/072; H01L 2224/3205; H01L 2224/48137; H01L 23/49811; H01L 25/18; H01L 24/73; H01L 2224/371; H01L 2224/41113; H01L 24/41; H01L 24/37; H01L 2224/0603; H01L 2224/40095; H01L 2224/40225;
(Continued)

(56) References Cited

U.S. PATENT DOCUMENTS

2017/0042053 A1  2/2017  Soyano
2020/0258853 A1  8/2020  Namba et al.

FOREIGN PATENT DOCUMENTS

EP  3442020 A1  2/2019
JP  H11177021 A  7/1999
(Continued)

*Primary Examiner* — Elias Ullah
(74) *Attorney, Agent, or Firm* — Rabin & Berdo, P.C.

(57) ABSTRACT

A semiconductor module includes an insulating substrate having a main wiring layer, positive and negative electrode terminals adjacently arranged in a first direction, a plurality of semiconductor elements forming a first column and another plurality of semiconductor elements forming a second column, each semiconductor element having gate and source electrode on an upper surface thereof, and being disposed on the main wiring layer such that corresponding ones of the gate electrodes in the first and second columns face each other in a second direction orthogonal to the first direction, a control wiring substrate between the first and second columns and having gate and source wiring layers, a gate wiring member connecting ones of the gate electrodes in the first and second columns through the gate wiring layer, and a source wiring member connecting ones of the source electrodes in the first and second columns through the source wiring layer.

10 Claims, 7 Drawing Sheets

(51) Int. Cl.
*H01L 23/498* (2006.01)
*H05K 1/02* (2006.01)
*H05K 1/14* (2006.01)

(52) U.S. Cl.
CPC ............ H01L 24/40 (2013.01); H01L 25/072 (2013.01); H05K 1/0298 (2013.01); H05K 1/142 (2013.01); *H01L 2224/32225* (2013.01); *H01L 2224/32245* (2013.01); *H01L 2224/40137* (2013.01); *H01L 2224/48175* (2013.01)

(58) Field of Classification Search
CPC . H01L 2224/73221; H01L 2924/00014; H01L 2924/181; H02M 7/5387; H02M 7/003
USPC .......................................................... 257/734
See application file for complete search history.

(56) References Cited

FOREIGN PATENT DOCUMENTS

| | | |
|---|---|---|
| JP | 2004063682 A | 2/2004 |
| JP | 2006041098 A | 2/2006 |
| JP | 2007306748 A | 11/2007 |
| JP | 2017037892 A | 2/2017 |
| WO | 2015116924 A1 | 8/2015 |
| WO | 2017163612 A1 | 9/2017 |
| WO | 2019064874 A1 | 4/2019 |

SEMICONDUCTOR MODULE

CROSS REFERENCE TO RELATED APPLICATIONS

This application is based upon and claims the benefit of priority of the prior Japanese Patent Application No. 2020-038367, filed on Mar. 6, 2020, the entire contents of which are incorporated herein by reference.

BACKGROUND OF THE INVENTION

Field of the Invention

The present invention relates to a semiconductor module.

Description of the Related Art

A semiconductor device has a substrate having thereon semiconductor elements such as an insulated gate bipolar transistor (IGBT), a power metal oxide semiconductor field effect transistor (MOSFET), or freewheeling diode (FWD) and is used in an inverter apparatus or the like (see Japanese Patent Laid-Open No. 2006-041098, Japanese Patent Laid-Open No. 2004-063682, International Publication No. WO 2017/163612, International Publication No. WO 2015/116924, Japanese Patent Laid-Open No. 11-177021, Japanese Patent Laid-Open No. 2017-037892, International Publication No. WO 2019/064874, and Japanese Patent Laid-Open No. 2007-306748, for example).

Japanese Patent Laid-Open No. 2006-041098 discloses a power module including a relay substrate that integrates and distributes signal wires between a plurality of parallel-connected power semiconductor elements to simplify and reduce the size of the signal wiring. Japanese Patent Laid-Open No. 2004-063682 discloses about a wiring substrate having thereon a gate wire and an emitter wire between upper and lower arms. International Publication No. WO 2017/163612 discloses that an insulating plate is disposed on an insulating substrate, and a conductor pattern for a control signal for a switching element is formed on the insulating plate. International Publication No. WO 2015/116924 discloses that a gate and source kelvin interconnection substrate is disposed between chip columns. Japanese Patent Laid-Open No. 11-177021 discloses that a gate electrode and a source electrode extend on a drain electrode through an insulating resin. Japanese Patent Laid-Open No. 2017-037892 discloses that a printed board is disposed on a partition wall within a case. International Publication No. WO 2019/064874 discloses disposing a control signal substrate having thereon a gate wire and an emitter wire between a plurality of power semiconductor elements.

In recent years, increases of the speed of switching have been demanded to reduce a switching loss that occurs upon operation in a power semiconductor module used for power control applications. In a power semiconductor module, when a semiconductor element is turned off, surge voltage ($\Delta V = L \times di/dt$) is applied to direct-current voltage of a power supply because of the time rate of change of current and wiring inductance. When surge voltage exceeding the resistance to pressure of the semiconductor element is applied, there is a possibility that the semiconductor element is deteriorated or is destroyed. Therefore, the wiring inductance is required to be as small as possible for driving the power semiconductor module with high-speed switching.

While technologies that attempt reduction of inductance and suppression of fluctuations of the inductance in a main circuit are disclosed in the literatures above, the inductance of the gate-source wiring between chips is also required to be reduced as much as possible in order to realize a further increase of the speed of switching. Therefore, for the further increase of the speed of switching, a structure that reduces inductance of the gate-source wiring and suppresses fluctuations of the inductance is demanded, in addition to the reduction of the inductance of the main circuit side and suppression of fluctuations of the inductance of the main circuit for each chip.

The present invention has been made in view of such points, and it is one of objects of the present invention to provide a semiconductor module that can reduce gate-source inductance and suppress fluctuations of the inductance.

SUMMARY OF THE INVENTION

A semiconductor module according to one aspect of the present invention includes an insulating substrate having a main wiring layer formed on an upper surface of the insulating substrate, a first external terminal and a second external terminal adjacently arranged in a line, a plurality of semiconductor elements each having a gate electrode and a source electrode on an upper surface of the semiconductor elements, forming a first column and a second column electrically connected in parallel with each other and in parallel with a direction of arrangement of the first external terminal and the second external terminal, and being disposed on the main wiring layer such that the gate electrodes of the first column and the gate electrodes of the second column face each other in a direction crossing the direction of arrangement, a control wiring substrate disposed between the first column and the second column and having a gate wiring layer and source wiring layer extending in parallel with the direction of arrangement, a gate wiring member connecting the gate electrodes and the gate wiring layer, and a source wiring member connecting the source electrodes and the source wiring layer.

Advantageous Effects of Invention

According to the present invention, reduction of gate-source inductance and suppression of fluctuations of the inductance can be realized.

DETAILED DESCRIPTION OF THE PREFERRED EMBODIMENTS

Figure 1:
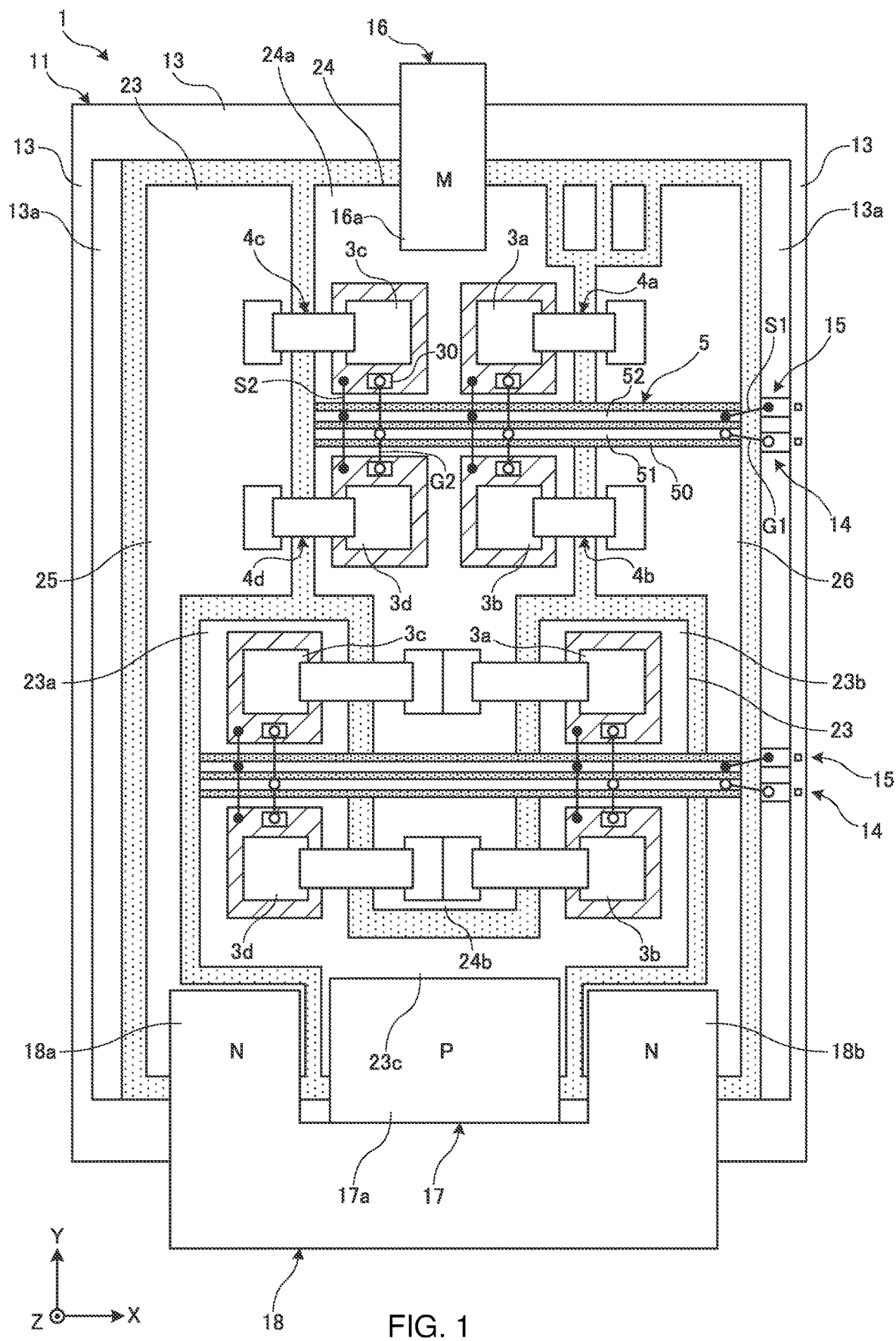
FIG. 1 is a plan view of a semiconductor device according to an embodiment.
Figure 2:
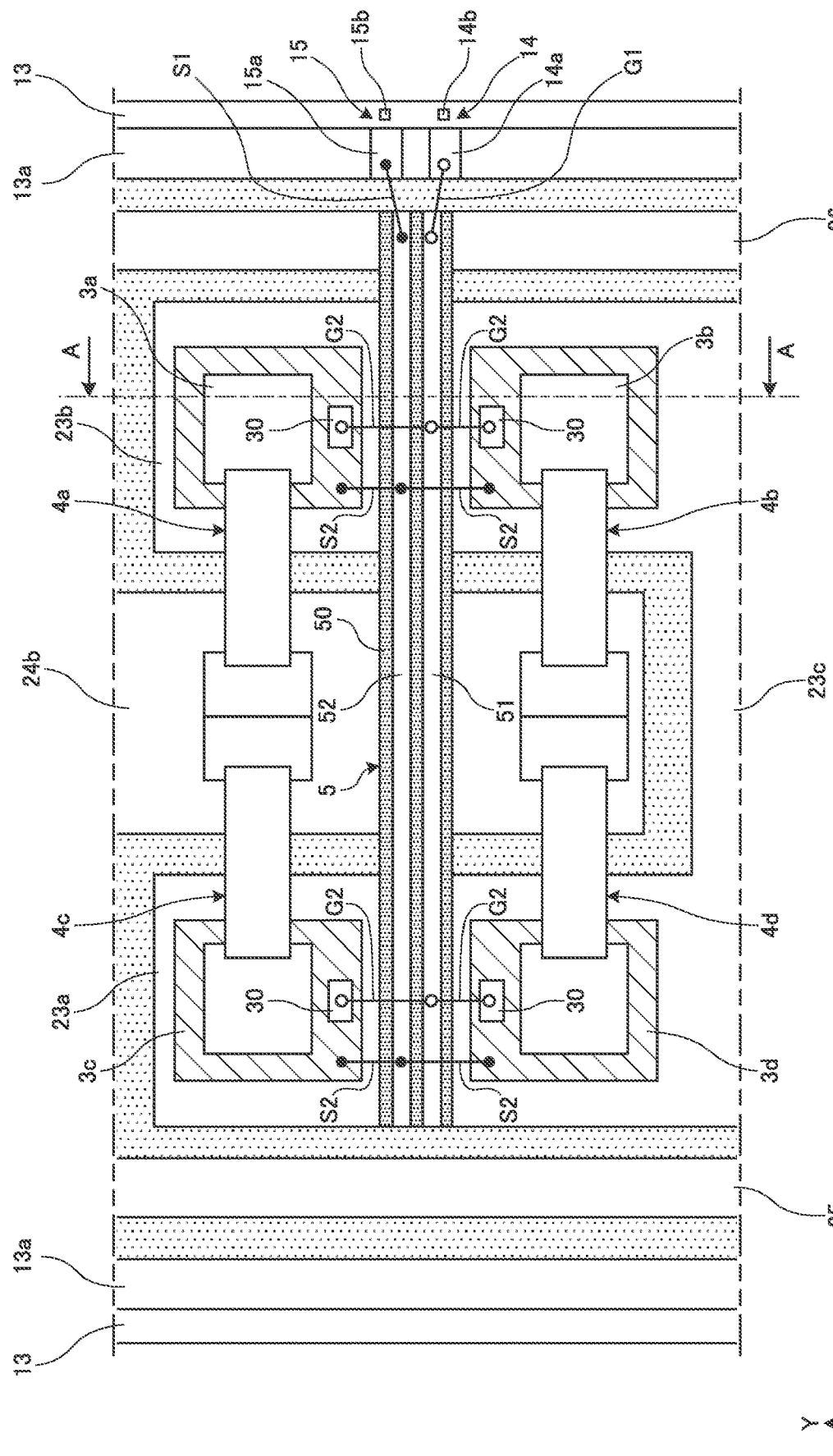
FIG. 2 is a partially enlarged view of an upper arm of the semiconductor device shown in FIG. 1.
Figure 3:
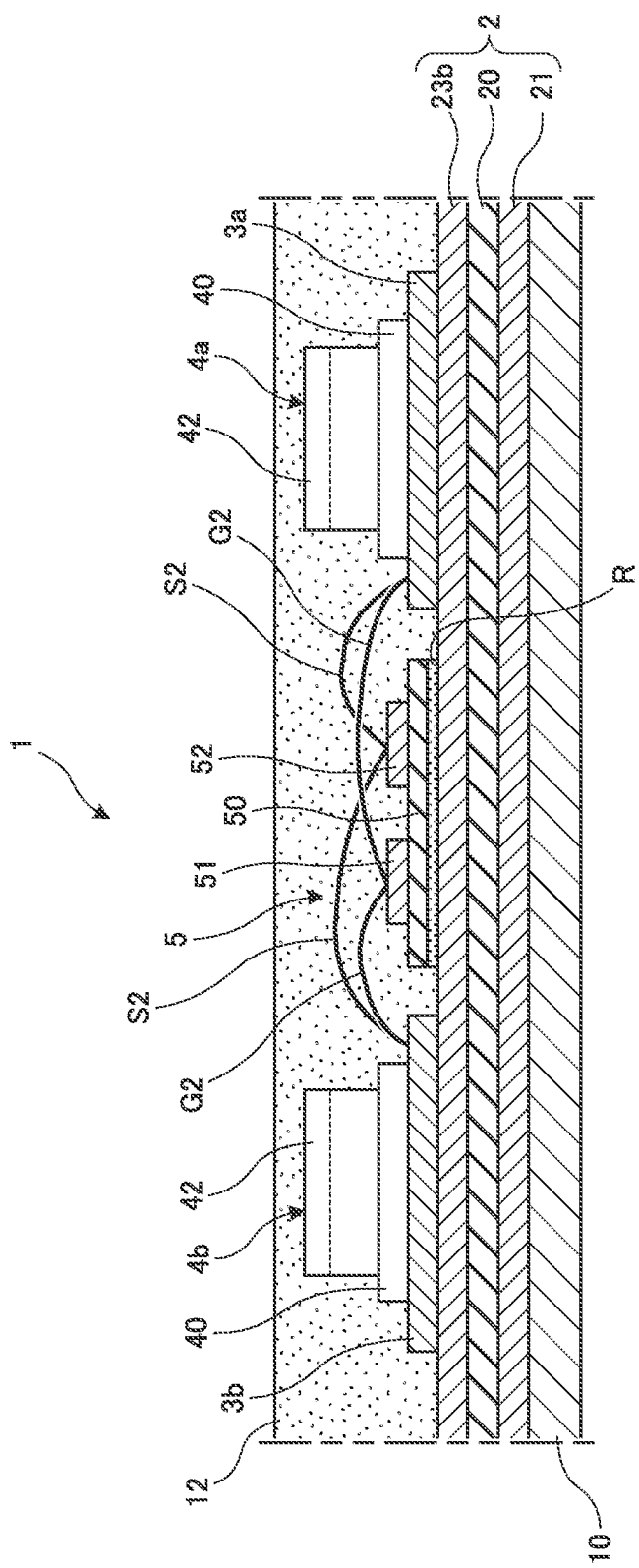
FIG. 3 is a cross-sectional view taken along Line A-A of the semiconductor device shown in FIG. 2.
Figure 4:
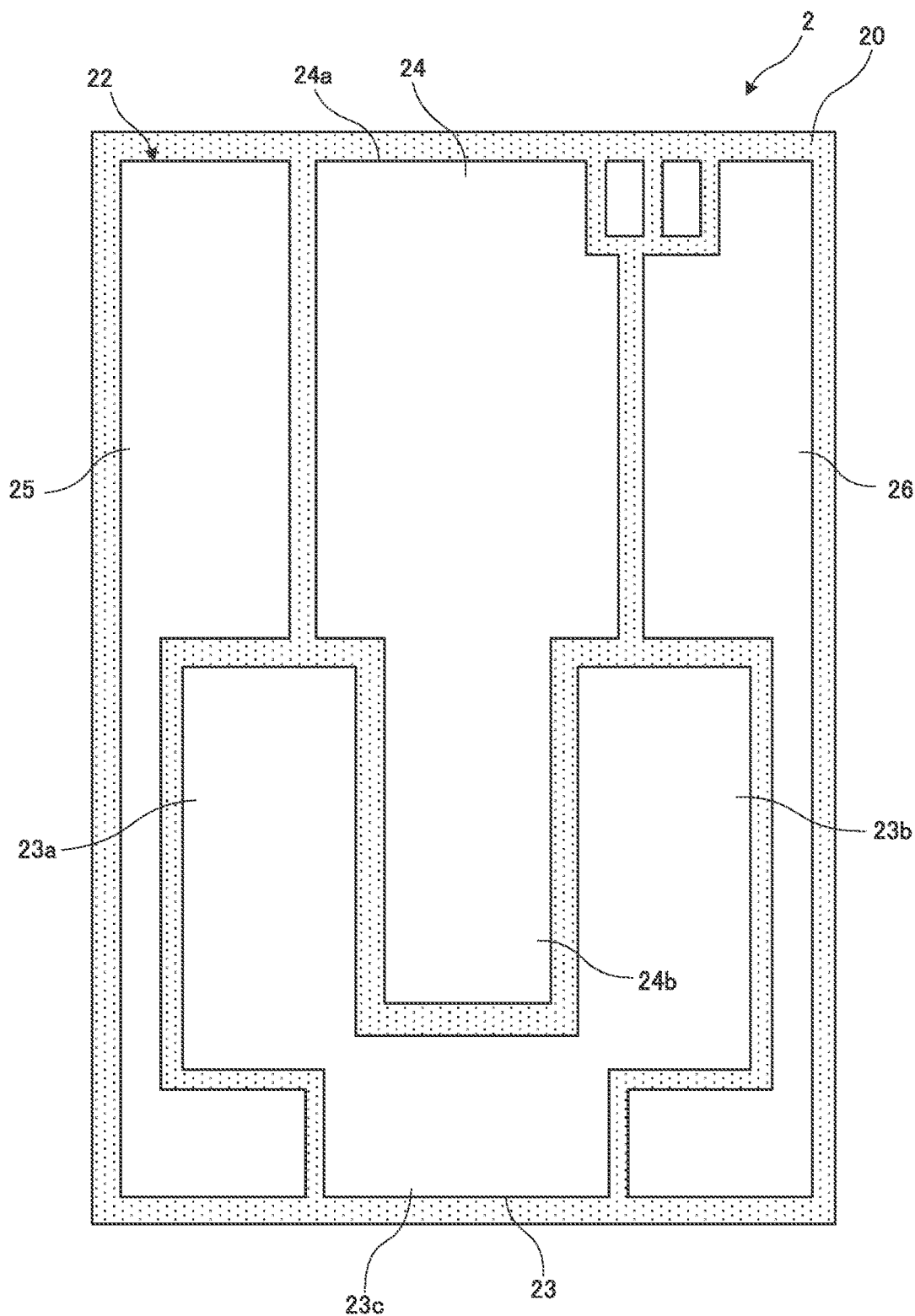
FIG. 4 is a plan view showing a layout of a circuit board according to the embodiment.
Figure 5:
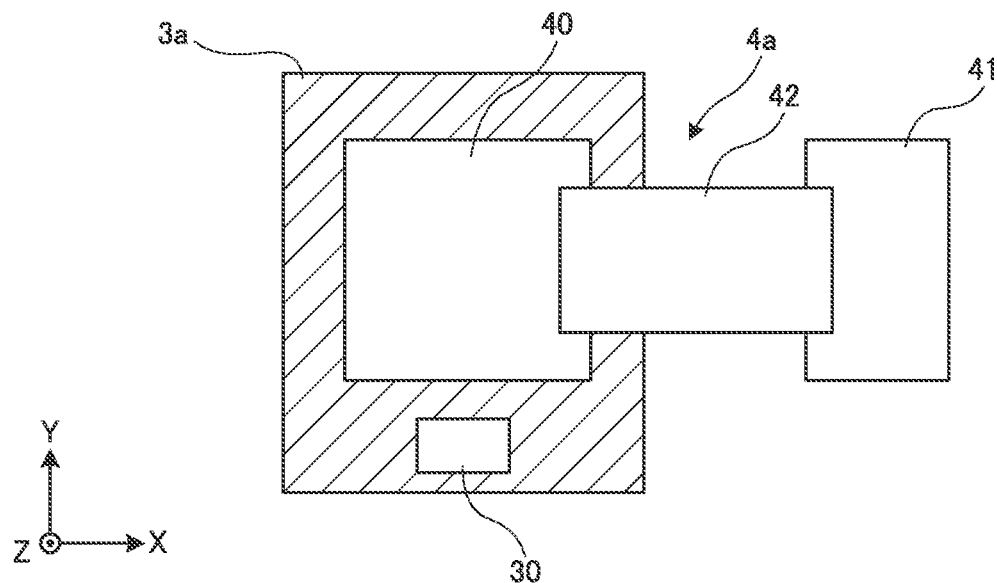
FIG. 5 is a plan view of a semiconductor element according to the embodiment.
Figure 6:
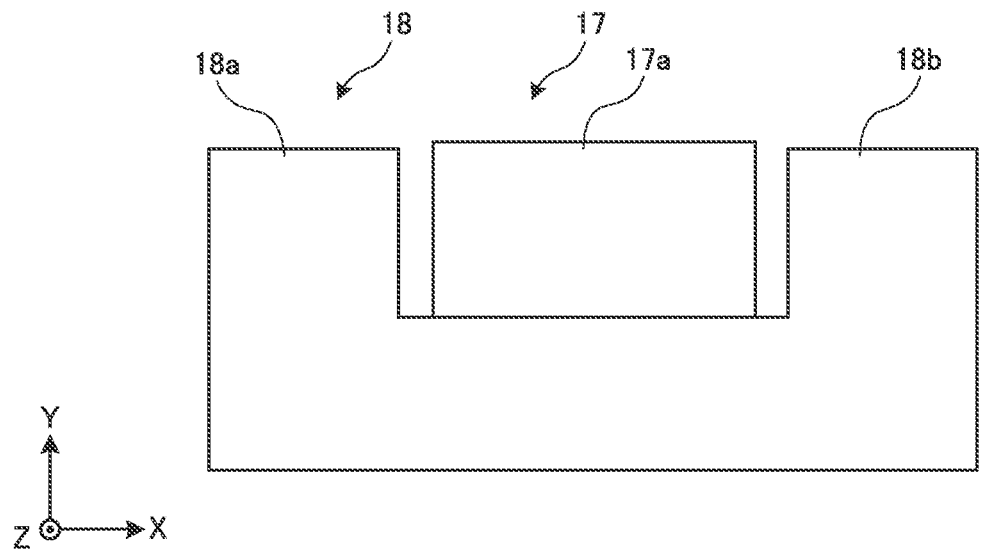
FIG. 6 is a plan view of a P terminal and an N terminal according to the embodiment.

A semiconductor module to which the present invention is applicable is described below. FIG. 1 is a plan view of a semiconductor device according to an embodiment. FIG. 2 is a partially enlarged view of an upper arm of the semiconductor device shown in FIG. 1. FIG. 3 is a cross-sectional view taken along Line A-A of the semiconductor device shown in FIG. 2. FIG. 4 is a plan view showing a layout of a circuit board according to the embodiment. FIG. 5 is a plan view of a semiconductor element according to the embodiment. FIG. 6 is a plan view of a P terminal and an N terminal according to the embodiment. Note that the semiconductor module described below is merely an example and, without limiting thereto, can be changed as required. In the following drawings, for convenience of illustration, an end of a gate wire is indicated by an open circle (○), and an end of a source wire is indicated by a solid circle (●).

In the following drawings, the direction in which a plurality of semiconductor modules are arranged, the direction in which an upper arm and a lower arm, which are connected in series, are arranged, and the direction of height are defined as an X-direction, a Y-direction, and a Z-direction, respectively. The shown X, Y, and Z axes are orthogonal to each other and forms a right-handed system. In some cases, the X, Y and Z-directions may be referred to as a right-left direction, a front-back direction, and a top-bottom direction, respectively. These directions (right-left, front-back and top-bottom directions) are words used for convenience of description, and, depending on the orientation of the attachment of the semiconductor device, the correspondence relationships with the XYZ directions may be changed. For example, the heat radiating surface side (cooler side) of the semiconductor device is referred to as a "lower surface side", and the opposite side is referred to as an "upper surface side". Planar view herein means that the upper surface of the semiconductor device is viewed from the Z-direction positive side.

The semiconductor device according to this embodiment is applied to a power conversion device in a power module, for example, and is a power module included in an inverter circuit. The semiconductor device includes a semiconductor module 1. With reference to FIG. 1, a single semiconductor module 1 is described. For example, in a case where the semiconductor device is included in a three-phase inverter circuit, three semiconductor modules in FIG. 1 are disposed side by side in order of a U phase, a V phase and a W phase.

As shown in FIGS. 1 to 4, the semiconductor module 1 includes a base plate 10, a laminate substrate 2 disposed on the base plate 10, a plurality of semiconductor elements disposed on the laminate substrate 2, a case member 11 that accommodates the laminate substrate 2 and the semiconductor elements, and a sealing resin 12 filled within the case member 11.

The base plate 10 is an oblong plate having an upper surface and a lower surface. The base plate 10 functions as a heatsink. The base plate 10 has a rectangular shape in planar view elongated in the X-direction. The base plate 10 is a metallic plate of, for example, copper, aluminum or an alloy thereof and the surface may be subjected to plating treatment.

The case member 11 that is rectangular in planar view and has a frame shape is disposed on the upper surface of the base plate 10. The case member 11 is molded with, for example, a synthetic resin and is jointed to the upper surface of the base plate 10 through an adhesive (not shown). The case member 11 has a shape following an external shape of the base plate 10 and is formed to have a frame shape by connecting, at four corners, a pair of side wall parts 13 facing each other in the X-direction and a pair of side wall parts 13 facing each other in the Y-direction.

On an inner side of the upper surface of the pair of side wall parts 13 facing each other in the X-direction, a step part 13a that is lower than the side wall parts 13 is formed. The step part 13a has an upper surface at a position lower than the upper end surfaces of the side wall parts 13. A gate terminal 14 and a source terminal 15 are integrally embedded as control terminals for external connection in the side wall part 13 positioned on the X-direction positive side of the pair of side wall parts 13 facing each other in the X-direction. The gate terminal 14 and the source terminal 15 are disposed such that their ends are exposed on the upper surface of the step part 13a.

The gate terminal 14 and the source terminal 15 are provided correspondingly in each of an upper arm and a lower arm, details of which are described below. One gate terminal 14 and one source terminal 15 are provided on the upper arm side (Y-direction negative side), and one gate terminal 14 and one source terminal 15 are provided on the lower arm side (Y-direction positive side). The gate terminal 14 and the source terminal 15 in each arm are disposed adjacently side by side in the Y direction. The gate terminal 14 is positioned on the Y-direction negative side, and the source terminal 15 is positioned on the Y-direction positive side.

The gate terminal 14 and the source terminal 15 are formed by bending a plate-like body of a metallic material such as a copper material, a copper-alloy-based material, an aluminum-alloy-based material or an iron-alloy-based material. The gate terminal 14 has a flat part 14a exposed on the upper surface of the step part 13a and a vertical part 14b having a tip projecting from the upper end surface of the side wall part 13. Similarly, the source terminal 15 has a flat part 15a exposed on the upper surface of the step part 13a and a vertical part 15b having a tip projecting from the upper end surface of the side wall part 13. A wiring member for control is connected to the flat parts 14a and 15a, the details of which are described below.

In the pair of side wall parts 13 facing each other in the Y-direction of the case member 11, an output terminal 16 (M terminal) as a case terminal is provided on the Y-direction positive side, and a positive electrode terminal (P terminal) and a negative electrode terminal 18 (N terminal) as case terminals are provided on the Y-direction negative side, the details of which are described below. The positive electrode terminal 17 (first external terminal) and the negative electrode terminal 18 (second external terminal) are adjacently arranged in a line in the X-direction.

Inside of the case member 11, the laminate substrate 2 is disposed on the upper surface of the base plate 10. The laminate substrate 2 is formed by stacking a metallic layer and an insulating layer and is configured by, for example, a direct copper bonding (DCB) substrate, an active metal brazing (AMB) substrate or a metallic base substrate. More specifically, the laminate substrate 2 has an insulating plate 20, a heatsink 21 disposed on a lower surface of the insulating plate 20, and a plurality of circuit boards 22 disposed on an upper surface of the insulating plate 20. The laminate substrate 2 is formed to be, for example, a rectangular shape in planar view.

The insulating plate 20 is formed to have a predetermined thickness in the Z-direction and to be a flat-shaped plate having an upper surface and a lower surface. The insulating plate 20 is formed from an insulating material such as a ceramics material such as alumina ($Al_2O_3$), aluminum nitride (AlN), or silicon nitride ($Si_3N_4$), a resin material such as epoxy, or an epoxy resin material using a ceramics material as a filler. The insulating plate 20 may also be referred to as an insulating layer or an insulating film.

The heatsink 21 is formed to have a predetermined thickness in the Z-direction and to cover the entire lower surface of the insulating plate 20. The heatsink 21 is formed by a metallic plate having a good thermal conductivity of, for example, copper or aluminum.

On the upper surface (main surface) of the insulating plate 20, the plurality of circuit boards 22 are formed to have independent island shapes where the circuit boards 22 are electrically insulated from each other. Each of the plurality of circuit boards 22 is configured by a metallic layer formed of, for example, copper foil and having a predetermined thickness. The plurality of circuit boards configure a main wiring layer through which a main current flows, the details of which are described below. More specifically, the plurality of circuit boards 22 include first to fourth conductive layers 23 to 26 each having a U-shape in planar view.

The first conductive layer 23 is disposed at a position deviated on the Y-direction negative side of the insulating plate 20 and has a U-shape in planar view that is open on the Y-direction positive side. The second conductive layer 24 is disposed on the Y-direction positive side of the insulating plate 20 more than the first conductive layer and is partially surrounded by the U-shaped first conductive layer 23. The third conductive layer 25 and the fourth conductive layer 26 have an elongated shape extending in the Y-direction and are disposed to partially surround the first conductive layer 23 and the second conductive layer 24. The third conductive layer 25 and the fourth conductive layer 26 are disposed to face each other in the X-direction. The third conductive layer 25 is positioned on the X-direction negative side, and the fourth conductive layer 26 is positioned on the X-direction positive side.

The first conductive layer 23 has a U-shape in planar view having an open end on the Y-direction positive side. More specifically, the first conductive layer 23 has a pair of first elongated parts 23a and 23b that extend in a predetermined direction (Y-direction) and face each other in the direction (X-direction) crossing the predetermined direction and a first connection part 23c that connects ends of the pair of first elongated parts 23a and 23b. The first connection part 23c connects ends on the Y-direction negative side of the pair of first elongated parts 23a and 23b. Four semiconductor elements (first to fourth semiconductor elements 3a to 3d) included in the upper arm (first arm) are disposed in a mirror image arrangement on the first conductive layer 23, the details of which are described below.

The second conductive layer 24 has a shape that connects two rectangular parts having different X-direction widths side by side in the Y-direction. More specifically, the second conductive layer 24 has a first rectangular part 24a positioned on the Y-direction positive side and a second rectangular part 24b positioned on the Y-direction negative side. The first rectangular part 24a has an X-direction width larger than the second rectangular part 24b. The second rectangular part 24b is provided between the pair of first elongated parts 23a and 23b. Four semiconductor elements (first to fourth semiconductor elements 3a to 3d) included in the lower arm (second arm) are disposed in a mirror image arrangement on the second conductive layer 24, the details of which are described below.

The plurality of semiconductor elements are disposed at predetermined positions on the upper surface of the circuit boards 22 through a jointing material (not shown) such as soldering. Each of the semiconductor elements is formed to have a square shape in planar view by a semiconductor substrate of, for example, silicon (Si), silicon carbide (SiC), or gallium nitride (GaN). According to this embodiment, each of the semiconductor elements is configured by a reverse conducting (RC)-IGBT element integrally having functions of an insulated gate bipolar transistor (IGBT) element and a freewheeling diode (FWD) element.

Without limiting thereto, each of the semiconductor elements may be configured by a combination of a switching element such as an IGBT, a power metal oxide semiconductor field effect transistor (MOSFET) or a bipolar junction transistor (BJT) and a diode such as a freewheeling diode (FWD). Alternatively, for example, a reverse blocking (RB)-IGBT having sufficient resistance to pressure against reverse bias may be used as the semiconductor elements. The shape, arranged number and arranged positions of the semiconductor elements may be changed as required.

According to this embodiment, eight semiconductor elements are disposed for one phase. More specifically, according to this embodiment, four semiconductor elements (first to fourth semiconductor elements 3a to 3d) included in the upper arm and other four semiconductor elements (first to fourth semiconductor elements 3a to 3d) included in the lower arm are provided. The upper arm is positioned on the Y-direction negative side, and the lower arm is positioned on the Y-direction positive side. In other words, the upper arm and the lower arm are disposed side by side in the direction of extension of the side wall part 13 having the gate terminals 14 and the source terminals 15 provided thereon.

Each of the semiconductor elements has an upper-surface electrode (which may be referred to as an emitter electrode or a source electrode) and a lower-surface electrode (which may be referred to as a collector electrode or a drain electrode). Each of the semiconductor elements further has a gate electrode 30 (see FIG. 5) disposed at a deviated position on the outer periphery side of the upper surface.

The four semiconductor elements forming the upper arm are disposed on the upper surface of the first conductive layer 23 and are electrically connected in parallel. More specifically, the first semiconductor element 3a and the second semiconductor element 3b are disposed on the upper surface of the first elongated part 23b, and the lower-surface electrodes thereof are conductively connected to the first elongated part 23b. The first semiconductor element 3a and the second semiconductor element 3b are aligned in the Y-direction and are disposed such that the gate electrodes 30 thereof face each other. The first semiconductor element 3a is positioned on the Y-direction positive side, and the second semiconductor element 3b is positioned on the Y-direction negative side. In other words, the first semiconductor element 3a and the second semiconductor element 3b are disposed on the X-direction positive side in parallel along the side wall part 13 extending in the Y-direction.

The third semiconductor element 3c and the fourth semiconductor element 3d are disposed at positions symmetric to the first semiconductor element 3a and the second semiconductor element 3b with respect to the X-direction center of the laminate substrate 2. More specifically, the third semiconductor element 3c and the fourth semiconductor element 3d are disposed on the upper surface of the first elongated part 23a, and the lower-surface electrodes thereof are conductively connected to the first elongated part 23a. The third semiconductor element 3c and the fourth semiconductor element 3d are aligned in the Y-direction and disposed such that the gate electrodes 30 thereof face each other. The third semiconductor element 3c is positioned on the Y-direction positive side, and the fourth semiconductor element 3d is positioned on the Y-direction negative side. In other words, the third semiconductor element 3c and the fourth semiconductor element 3d are disposed in parallel on the X-direction negative side along the side wall part 13 extending in the Y-direction. In this way, the first semiconductor element 3a and the third semiconductor element 3c face each other in the X-direction, and the second semiconductor element 3b and the fourth semiconductor element 3d face each other in the X-direction.

In the same manner, the four semiconductor elements forming the lower arm are disposed on the upper surface of the second conductive layer 24 and are electrically connected in parallel. More specifically, the first semiconductor element 3a and the second semiconductor element 3b are disposed on the upper surface on the X-direction positive side of the first rectangular part 24a, and the lower-surface electrodes thereof are conductively connected to the first rectangular part 24a. The first semiconductor element 3a and the second semiconductor element 3b are aligned in the Y-direction and disposed such that the gate electrodes 30 thereof face each other. The first semiconductor element 3a is positioned on the Y-direction positive side, and the second semiconductor element 3b is positioned on the Y-direction negative side. In other words, the first semiconductor element 3a and the second semiconductor element 3b are disposed in parallel on the X-direction positive side along the side wall part 13 extending in the Y-direction.

The third semiconductor element 3c and the fourth semiconductor element 3d are disposed at positions symmetric to the first semiconductor element 3a and the second semiconductor element 3b with respect to the X-direction center of the laminate substrate 2. More specifically, the third semiconductor element 3c and the fourth semiconductor element 3d are disposed on the upper surface on the X-direction negative side of the first rectangular part 24a, and the lower-surface electrodes thereof are conductively connected to the first rectangular part 24a. The third semiconductor element 3c and the fourth semiconductor element 3d are aligned in the Y-direction and disposed such that the gate electrodes 30 thereof face each other. The third semiconductor element 3c is positioned on the Y-direction positive side, and the fourth semiconductor element 3d is positioned on the Y-direction negative side. In other words, the third semiconductor element 3c and the fourth semiconductor element 3d are disposed in parallel on the X-direction negative side along the side wall part 13 extending in the Y-direction. In this way, the first semiconductor element 3a and the third semiconductor element 3c face each other in the X-direction, and the second semiconductor element 3b and the fourth semiconductor element 3d face each other in the X-direction.

The upper arm and lower arm described above are connected in series. As shown in FIG. 1, the lower arm is disposed at a position deviated to the output terminal 16, which is described below, and the upper arm is disposed at a position deviated to the positive electrode terminal 17 or the negative electrode terminal 18. The first semiconductor element 3a, the second semiconductor element 3b, the third semiconductor element 3c and the fourth semiconductor element 3d included in the upper arm are disposed away from the X-direction center of the laminate substrate 2, while the first semiconductor element 3a, the second semiconductor element 3b, the third semiconductor element 3c and the fourth semiconductor element 3d included in the lower arm are disposed closely to the X-direction center of the laminate substrate 2.

According to this embodiment, in each of the arms, a first column is formed by the first semiconductor element 3a and the third semiconductor element 3c arranged in the X-direction, and a second column is formed by the second semiconductor element 3b and the fourth semiconductor element 3d arranged in the X-direction. The first column and the second column are electrically connected in parallel with each other and in parallel with the X-direction that is the direction of arrangement of the positive electrode terminal 17 and the negative electrode terminal 18. The first column and the second column are disposed such that the gate electrodes thereof face each other inwardly in the Y-direction.

The upper-surface electrodes of the semiconductor elements and the predetermined circuit boards 22 are electrically connected via metallic wiring boards (first to fourth wires 4a to 4d) as a main current wiring member. The first wire 4a connects the upper-surface electrode of the first semiconductor element 3a and the second rectangular part 24b or the fourth conductive layer 26. The second wire 4b connects the upper-surface electrode of the second semiconductor element 3b and the second rectangular part 24b or the fourth conductive layer 26. The third wire 4c connects the upper-surface electrode of the third semiconductor element 3c and the second rectangular part 24b or the third conductive layer 25. The fourth wire 4d connects the upper-surface electrode of the fourth semiconductor element 3d and the second rectangular part 24b or the third conductive layer 25.

Each of the metallic wiring boards is formed by bending, through, for example, press processing, a metallic material such as a copper material, a copper-alloy-based material, an aluminum-alloy-based material or an iron-alloy-based material. Because all of the metallic wiring boards have the same configuration, a common reference is given for description. More specifically, as shown in FIG. 3 and FIG. 5, the metallic wiring board includes a first junction part 40 to be jointed with the upper-surface electrode of the predetermined semiconductor element, a second junction part 41 to be jointed with the predetermined circuit board 22, and a connection part 42 that connects the first junction part 40 and the second junction part 41. The shape of the metallic wiring board shown in FIG. 3 and FIG. 5 is merely an example and can be changed as required. Each of the metallic wiring boards may be referred to as a lead frame. The metallic wiring boards (first to fourth wires 4a to 4d) extend in the X-direction in the planar view shown in FIG. 1.

In the case member 11, the output terminal 16, the positive electrode terminal 17, and the negative electrode terminal 18 are provided as case terminals for external connection of the main current as described above. The output terminal 16 is disposed on the Y-direction positive side of the pair of side wall parts 13 facing each other in the Y-direction of the case member 11. The positive electrode terminal 17 and the negative electrode terminal 18 are disposed on the Y-direction negative side of the pair of side wall parts 13 facing each other in the Y-direction of the case member 11.

Each of those case terminals are formed by, for example, press processing on, for example, a metallic material such as a copper material, a copper-alloy-based material, an aluminum-alloy-based material or an iron-alloy-based material. The output terminal 16 has an output end 16a connected to the first rectangular part 24a.

As shown in FIG. 1 and FIG. 6, the positive electrode terminal 17 has a positive electrode end 17a connected to the first connection part 23c. The negative electrode terminal 18 has two branching negative electrode ends 18a and 18b. The negative electrode ends 18a and 18b are disposed side by side in the X-direction with a predetermined interval therebetween. The positive electrode terminal 17 (positive electrode end 17a) is provided between the negative electrode ends 18a and 18b. The negative electrode end 18a positioned on the X-direction negative side is connected to an end on the Y-direction negative side of the third conductive layer 25. The negative electrode end 18b positioned on the X-direction positive side is connected to an end on the Y-direction negative side of the fourth conductive layer 26.

According to this embodiment, separately from the laminate substrate 2 having the main wiring layer formed thereon, a control wiring substrate 5 having a control wiring layer formed thereon for control wires is provided. The control wiring substrate 5 is formed by stacking a metallic layer and an insulating layer and is, for example, configured by a printed board. One control wiring substrate 5 is provided for each of the arms and is disposed on the upper surface of the laminate substrate 2. The arranged positions of the control wiring substrates 5 are described below.

Each of the control wiring substrates 5 is configured to include an insulating plate 50 and a gate wiring layer 51 and source wiring layer 52 formed on the upper surface of the insulating plate 50. The insulating plate 50 is formed to be an elongated body that is long in the X-direction. The gate wiring layer 51 and the source wiring layer 52 are configured by a metallic layer formed of, for example, copper foil and having a predetermined thickness.

The gate wiring layer 51 and the source wiring layer 52 have an elongated shape extending in parallel with the X-direction that is the direction of arrangement of the above-described first column or second column of the semiconductor elements and have an X-direction length corresponding to (equal to) the insulating plate 50. The Y-direction width of the gate wiring layer 51 and source wiring layer 52 is set smaller than insulating plate 50. The gate wiring layer 51 and the source wiring layer 52 are disposed side by side in the Y-direction adjacently to each other. The gate wiring layer 51 is positioned on the Y-direction negative side, and the source wiring layer 52 is positioned on the Y-direction positive side.

In each of the arms, the control wiring substrate 5 is disposed on the upper surface of the laminate substrate 2 through a jointing material R. More specifically, in the upper arm, the control wiring substrate 5 is disposed across the first conductive layer 23 (first elongated parts 23a, 23b), the second conductive layer 24 (second rectangular part 24b), and the fourth conductive layer 26 between the first column and second column of the semiconductor elements. Similarly, in the lower arm, the control wiring substrate 5 is disposed across the second conductive layer 24 (first rectangular part 24a) and the fourth conductive layer 26 between the first column and second column of the semiconductor elements.

In this way, the control wiring substrate 5 is disposed between the first semiconductor element 3a and the second semiconductor element 3b and between the third semiconductor element 3c and the fourth semiconductor element 3d where the gate electrodes 30 thereof face each other.

The above-described gate terminal 14 and the source terminal 15 and the control wiring substrate 5, and the control wiring substrate 5 and the semiconductor elements are electrically connected by predetermined wiring members. More specifically, the end (flat part 14a) of the gate terminal 14 and an end on the X-direction positive side of the gate wiring layer 51 are connected by a first gate wire G1. The end (flat part 15a) of the source terminal 15 and an end on the X-direction positive side of the source wiring layer 52 are connected by a first source wire S1. In other words, the end of the first gate wire G1 and the end of the first source wire Si are connected to the control wiring substrate 5 in an upper part of the fourth conductive layer 26.

The gate electrodes 30 of the semiconductor elements and the gate wiring layer 51 are connected by a second gate wire G2. The source electrodes (upper-surface electrodes) of the semiconductor elements and the source wiring layer 52 are connected by a second source wire S2. In the pair of the semiconductor elements (first semiconductor element 3a and the second semiconductor element 3b, or the third semiconductor element 3c and the fourth semiconductor element 3d) facing each other in the Y-direction across the control wiring substrate 5, the second gate wire G2 and the second source wire S2 are arranged side by side in a straight line in the Y-direction.

As these wiring members, a conductor wire (bonding wire) is used. The conductor wire can be made of one or a combination of gold, copper, aluminum, a gold alloy, a copper alloy and an aluminum alloy. A member other than the conductor wire can be used as the wiring members. For example, a ribbon can be used as the wiring members.

Since the inductance between PN terminals affects a switching loss in a semiconductor module, reduction of the inductance has been demanded. With the recent innovation of technologies, when a next-generation device (which may also be referred to as a wideband gap semiconductor) of SiC, GaN, or the like is adopted, further reduction of the inductance is demanded. Not only the inductance between the PN terminals but also the gate-source inductance are required to be reduced as much as possible.

Accordingly, the present inventors have focused on the layout of the circuit boards, semiconductor elements, case terminals and control terminals on an insulating substrate and have reached the present invention. More specifically, according to this embodiment, separately from the laminate substrate 2 having the main wiring layer formed thereon, the control wiring substrate 5 having the control wiring layer formed thereon is disposed on the laminate substrate 2, as shown in FIG. 1. The control wiring substrate 5 is provided between a plurality of semiconductor elements disposed such that the gate electrodes 30 thereof face each other. The gate electrodes 30 and the gate wiring layer 51 are connected by the second gate wire G2. The source electrodes and the source wiring layer 52 are connected by the second source wire S2.

On the control wiring substrate 5, the gate wiring layer 51 and the source wiring layer 52 are disposed so as to cross the main current flowing through the main wiring layer. In other words, the gate wiring layer 51 and source wiring layer 52 extending in the X-direction cross the Y-direction that is the direction of the main current flowing through the main wiring layer.

The gate terminal 14 and the source terminal 15 are provided on an end (one end side) on the X-direction positive side of the control wiring substrate 5. The gate terminal 14 and an end of the gate wiring layer 51 are connected by the first gate wire G1 that is another gate wiring member. The source terminal 15 and an end of the source wiring layer 52 are connected by the first source wire S1 that is another source wiring member.

With these configurations, the separate provision of the control wiring substrate 5 for control wiring from the main wiring layer simplifies the configuration of the laminate substrate 2. As a result, the size of the laminate substrate 2 can be reduced, compared with the configuration having the control wiring provided on the same insulating plate 20. Because the control wiring substrate 5 is disposed between the plurality of facing gate electrodes 30, the lengths of the gate wires and source wires connecting them can be reduced as much as possible. Therefore, reduction of the gate-source inductance can be attempted.

The gate wires and the corresponding source wires are wired adjacently to each other so as to have an equal length. As a result, fluctuations of the gate-source inductance can be suppressed. Furthermore, on the control wiring substrate 5, the gate wiring layer 51 and the source wiring layer 52 are disposed adjacently and in parallel with each other. Thus, because of the effect of the mutual inductance, the gate-source inductance can further be reduced.

The reduction of the wire lengths as described above can reduce the diameters of the wires as the wiring members more than before. Thus, the sizes of the electrodes (such as the gate electrodes 30) to which the wires are connected can be reduced. This can also result in contribution to reduction of the size of the entire module.

As shown in FIG. 3, the second gate wire G2 and the second source wire S2 are provided at lower positions than the height position of the highest ends of the metallic wiring boards (the upper surface of the connection part 42). Thus, the height in the Z-direction of the entire module can be reduced, and the size of the entire module can be reduced.

According to this embodiment, in order to reduce the PN inductance, (1) the number of parallel columns through which the main current flows is increased from conventional one to two; and (2) a wiring pattern (circuit board layout) is adopted in which the current paths between the P terminal and the N terminal are parallel with each other such that the length of the current paths can be reduced as much as possible.

More specifically, the first to fourth semiconductor elements 3a to 3d on one side form the upper arm (first arm), and the first to fourth semiconductor elements 3a to 3d on the other side form the lower arm (second arm). The upper arm and the lower arm are disposed side by side in the direction (Y-direction) of extension of the side wall part 13 having the gate terminals 14 and the source terminals 15 provided thereon. On the upper arm side, the positive electrode terminal 17 (first external terminal) and the negative electrode terminal 18 (second external terminal) are adjacently arranged in a line. The positive electrode terminal 17 has the positive electrode end 17a (first end) to be electrically connected to the upper arm. The negative electrode terminal 18 has at least two branching negative electrode ends 18a and 18b (second ends) electrically connected to the lower arm. The positive electrode end 17a is disposed between the two negative electrode ends 18a and 18b.

Figure 7:
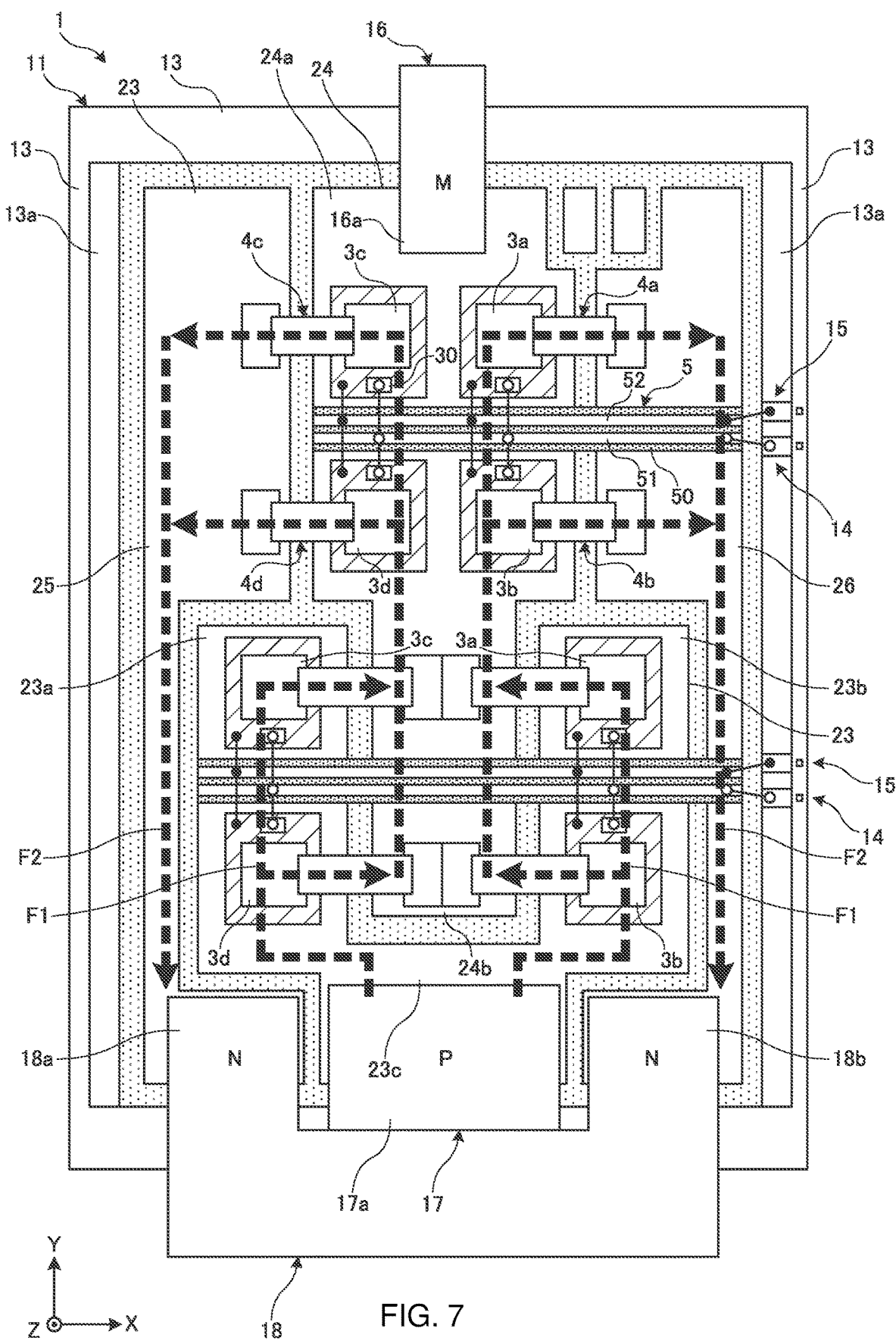
FIG. 7 is a schematic view showing flows of current in a semiconductor module according to the embodiment.

With reference to FIG. 7, flows of the main current are now described. FIG. 7 is a schematic diagram showing flows of current in the semiconductor module according to this embodiment. As shown in FIG. 7, in the semiconductor module 1, the main current flowing from the positive electrode terminal 17 is divided into two by the first elongated parts 23a and 23b on both outer sides. The main current flows from the first conductive layer 23 (the pair of first elongated parts 23a and 23b) through the first to fourth semiconductor elements 3a to 3d in the upper arm in the second conductive layer 24 (second rectangular part 24b). The main current further flows from the third conductive layer 25 and the fourth conductive layer 26 to the negative electrode ends 18a and 18b through the first to fourth semiconductor elements 3a to 3d in the lower arm.

In this way, according to this embodiment, as shown in FIG. 7, the current path F1 in the upper arm and the current path F2 in the lower arm are parallel and adjacent to each other, and the main currents flow in the opposite directions to each other. Therefore, because of the effect of the mutual inductance, reduction of the inductance can be realized, and the switching loss is reduced. Since a configuration is adopted in which each of the case terminals has a plurality of branching ends, the degree of adhesion between the other members can be improved when sealed with a resin, and the members cannot be easily peeled off. The entire layout is disposed in a mirror image arrangement as described above. Therefore, even though the current path is divided into two, deviation of the currents does not easily occur, and local heating can be suppressed.

According to this embodiment, as described above, not only the inductance between the PN terminals can be reduced, but also the gate-source inductance can be reduced, and fluctuations of the inductances can further be suppressed.

In the embodiment above, the number and arranged positions of the semiconductor elements are not limited to the configuration above but can be changed as required.

In the embodiment above, the number and layout of the circuit boards are not limited to the configuration above but can be changed as required.

Although the laminate substrate 2 and the semiconductor elements are formed to be in a rectangular shape or square shape in planar view according to the embodiment above, the present invention is not limited to the configuration. The laminate substrate 2 and the semiconductor elements may be formed to have a polygonal shape other than those described above.

Having described that, according to the embodiment above, the upper arm is positioned on the Y-direction negative side and the lower arm is positioned on the Y-direction positive side, the present invention is not limited to the configuration. The positional relationship between the upper and lower arms may be reversed from the one described above.

Although the positive electrode end 17a is provided between the two negative electrode ends 18a and 18b in the above-described embodiment, the present invention is not limited to the configuration. The positional relationship between the positive electrode terminal 17 and the negative electrode terminal 18 may be reversed from the one described above.

Although one end of the source wire is directly connected to the source electrode in the above-described embodiment, the present invention is not limited to the configuration. One end of the source wire may be connected to the source electrode (upper-surface electrode of the semiconductor element) through the metallic wiring board (first junction part 40).

Although, according to the above-described embodiment, the second gate wire G2 and the second source wire S2 extend in the Y-direction orthogonal to the X-direction in planar view, the present invention is not limited to the configuration. For example, at least one of the second gate wire G2 and the second source wire S2 may be tilted in the direction crossing the direction (Y-direction) of the main current flowing through the main wiring layer in planar view. In other words, the second gate wire G2 or the second source wire S2 may be disposed to be tilted diagonally to the Y-direction in planar view. With this configuration, the main current cannot easily affect between the source and the gate. By tilting a predetermined wire, the length of all of the control wires including the control wiring layer can be an equal length for each semiconductor element, and fluctuations of the inductances can be suppressed.

Figure 8:
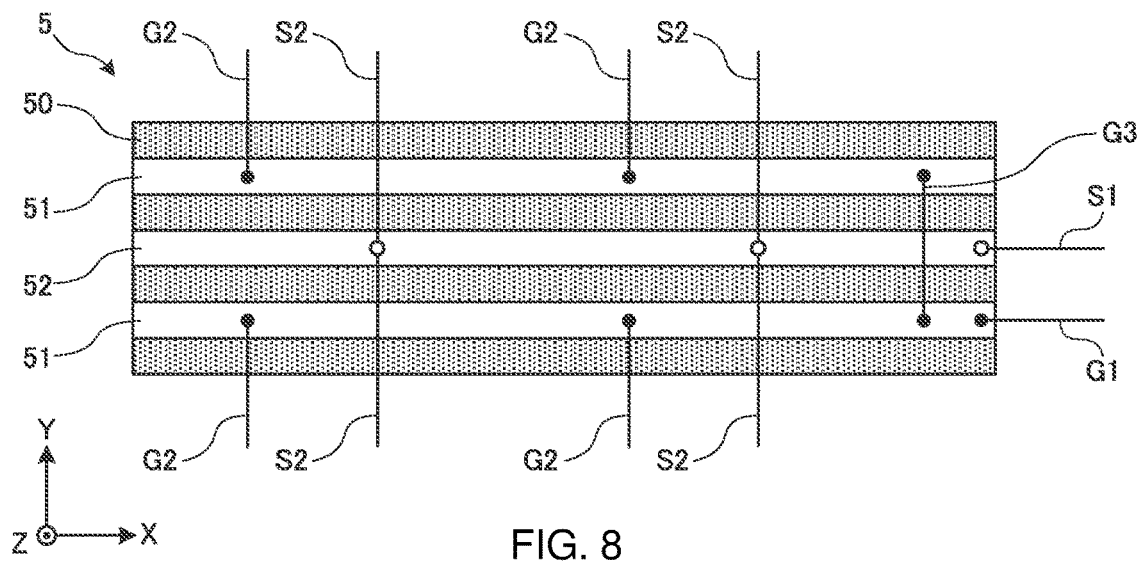
FIG. 8 is a schematic view of a control wiring substrate according to a first variation example.
Figure 9A:
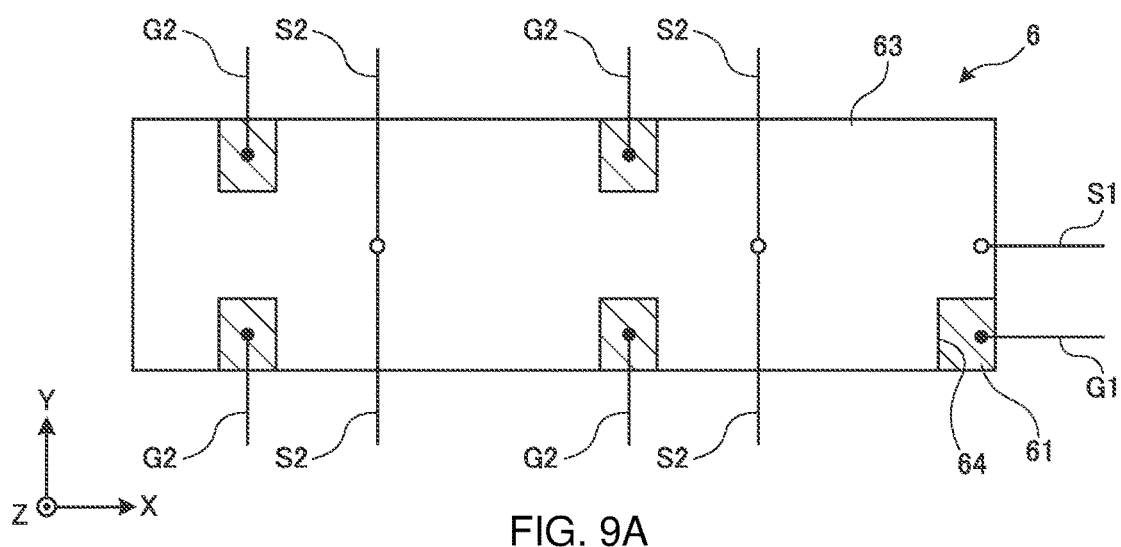
FIGS. 9A and 9B are schematic view of the control wiring substrate according to a second variation example.
Figure 9B:
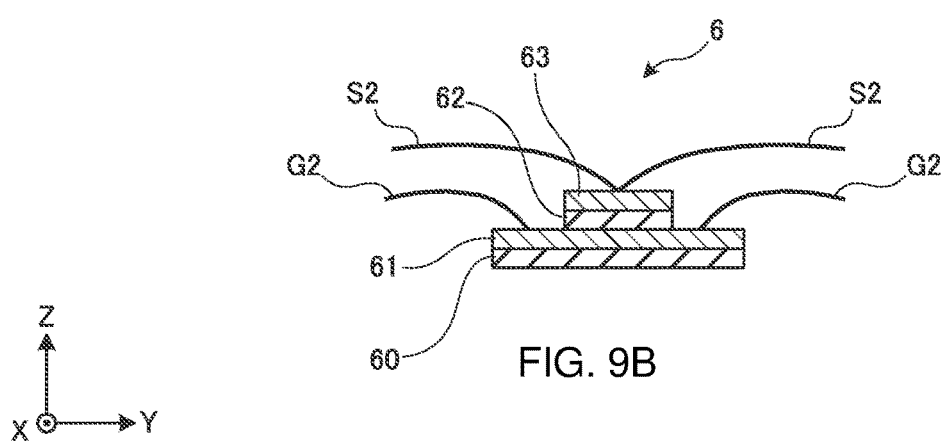

The control wiring substrate 5 is not limited to the above-described configuration but may be changed as required. For example, the control wiring substrate 5 may have a configuration as shown in FIG. 8 or 9. FIG. 8 is a schematic view of a control wiring substrate according to a first variation example, and FIG. 9 is a schematic view of a control wiring substrate according to a second variation example. FIG. 9A is a plan view of the control wiring substrate, and FIG. 9B is a cross-sectional view of a predetermined part in FIG. 9A taken along the Y-direction. In the following variation examples, the corresponding components are denoted by reference numerals identical to those in the description above, and description is properly omitted.

As shown in FIG. 8, the control wiring substrate 5 according to the first variation example has an insulating plate 50 on which two gate wiring layers 51 are formed in parallel with the X-direction and one source wiring layer 52 is formed between the two gate wiring layers 51. A predetermined gate electrode 30 (not shown in FIG. 8) and the gate wiring layer 51 are connected by the second gate wire G2. A predetermined source electrode (not shown) and the source wiring layer 52 are connected by the second source wire S2 across one of the gate wiring layers 51. The two gate wiring layers 51 are connected to each other by a third gate wire G3 extending in the Y-direction across the source wiring layer 52. An end of one of the gate wiring layers 51 and the gate terminal 14 (not shown in FIG. 8) are connected by the first gate wire G1. An end of the source wiring layer 52 and the source terminal 15 (not shown in FIG. 8) are connected by the first source wire S1. In this way, the numbers of the disposed gate wiring layer 51 and the source wiring layer 52 are not limited to one but may be two or more.

As shown in FIG. 9, a control wiring substrate 6 according to the second variation example is configured by a multi-layer board that is multi-layered by sandwiching an insulating layer (second insulating layer 62) between a gate wiring layer 61 and a source wiring layer 63. More specifically, the control wiring substrate 6 includes a first insulating plate 60, the gate wiring layer 61 formed on an upper surface of the first insulating plate 60, the second insulating layer 62 formed on an upper surface of the gate wiring layer 61, and the source wiring layer 63 formed on an upper surface of the second insulating layer 62. The control wiring substrate 6 has a rectangular shape in planar view as a whole. Each of the layers included in the control wiring substrate 6 also has a rectangular shape corresponding thereto.

In the second variation example, a plurality of notches 64 are provided for exposing the gate wiring layer 61 in planar view. The notches 64 are formed by cutting out the source wiring layer 63 and the second insulating layer 62 correspondingly to predetermined gate wires (the first gate wire G1 and the second gate wire G2). Ends of the first gate wire G1 or the second gate wire G2 are connected to an upper surface of the gate wiring layer 61 exposed by the notches 64. Ends of the source wires (the first source wire S1 and the second source wire S2) are connected to an upper surface of the source wiring layer 63. Note that, in the second variation example, the positional relationship (order of stacking) in the Z-direction of the gate wiring layer 61 and the source wiring layer 63 may be reversed.

Having described the embodiment and the variation examples, the embodiment and the variation examples may be wholly or partially combined as another embodiment.

The embodiments are not limited to the above-described embodiment and variation examples, and various changes, replacements and modifications may be made thereto without departing from the spirit and scope of the technical idea. If the technical idea can be implemented in another manner based on a technological advancement or another technology derived therefrom, the technical idea may be carried out by such method. Therefore, the claims cover all embodiments that can be included within the scope of the technical idea.

Feature points of the above-described embodiment are organized below.

A semiconductor module according to the above-described embodiment includes an insulating substrate having a main wiring layer formed on an upper surface of the insulating substrate, a first external terminal and a second external terminal adjacently arranged in a line, a plurality of semiconductor elements each having a gate electrode and a source electrode on an upper surface of the semiconductor elements, forming a first column and a second column electrically connected in parallel with each other and in parallel with a direction of arrangement of the first external terminal and the second external terminal, and being disposed on the main wiring layer such that the gate electrodes of the first column and the gate electrodes of the second column face each other in a direction crossing the direction of arrangement, a control wiring substrate disposed between the first column and the second column and having a gate wiring layer and source wiring layer extending in parallel with the direction of arrangement, a gate wiring member connecting the gate electrodes and the gate wiring layer, and a source wiring member connecting the source electrodes and the source wiring layer.

In the semiconductor module described above, the control wiring substrate is disposed such that the gate wiring layer and the source wiring layer cross a main current flowing through the main wiring layer.

In the semiconductor module described above, the control wiring substrate has an insulating plate on which the gate wiring layer and the source wiring layer are disposed.

In the semiconductor module described above, at least one of the gate wiring member and the source wiring member is tilted in a direction crossing a direction of the main current flowing through the main wiring layer.

In the semiconductor module described above, the control wiring substrate has an insulating plate having two gate wiring layers formed in parallel and having one source wiring layer formed between the two gate wiring layers.

In the semiconductor module described above, the control wiring substrate is configured by a multilayer board that is multi-layered by sandwiching an insulating layer between the gate wiring layer and the source wiring layer.

The semiconductor module described above further includes a metallic wiring board electrically connecting upper-surface electrodes provided in the semiconductor elements and the main wiring layer. The gate wiring member and the source wiring member are lower than a height position of the metallic wiring board.

The semiconductor module described above further includes a gate terminal and source terminal provided on one end side of the control wiring substrate, another gate wiring member connecting the gate terminal and an end of the gate wiring layer, and another source wiring member connecting the source terminal and an end of the source wiring layer.

In the semiconductor module described above, the plurality of semiconductor elements have an upper arm formed by the first column and the second column and a lower arm formed by another first column and second column, the main wiring layer has a first conductive layer to which lower-surface electrodes of the upper arm are conductively connected, and a second conductive layer to which lower-surface electrodes of the lower arm are conductively connected, the first external terminal is a positive electrode terminal having a positive electrode end connected to the first conductive layer, the second external terminal is a negative electrode terminal having at least two branching negative electrode ends, and the positive electrode terminal is disposed between one and the other of the negative electrode ends.

In the above described semiconductor module, the upper arm and the lower arm have the semiconductor elements forming the first column and the second column and being disposed to be symmetric with respect to a center of the insulating substrate, and the semiconductor elements included in the lower arm are disposed closely to the center of the insulating substrate while the semiconductor elements included in the upper arm are disposed away from the center of the insulating substrate.

INDUSTRIAL APPLICABILITY

As described above, the present invention has an effect that the gate-source inductance can be reduced and is particularly advantageous in a semiconductor module.

REFERENCE SIGNS LIST

1: semiconductor module
2: laminate substrate
3a: first semiconductor element
3b: second semiconductor element
3c: third semiconductor element
3d: fourth semiconductor element
4a: first wire (metallic wiring board)
4b: second wire (metallic wiring board)
4c: third wire (metallic wiring board)
4d: fourth wire (metallic wiring board)
5: control wiring substrate
6: control wiring substrate
10: base plate
11: case member
12: sealing resin
13: side wall part
13a: step part
14: gate terminal
14a: flat part
14b: vertical part
15: source terminal
15a: flat part
15b: vertical part
16: output terminal
16a: output end
17: positive electrode terminal (first external terminal)
17a: positive electrode end
18: negative electrode terminal (second external terminal)
18a: negative electrode end
18b: negative electrode end
20: insulating plate
21: heatsink
22: circuit board (main wiring layer)
23: first conductive layer
23a: first elongated part
23b: first elongated part
23c: first connection part
24: second conductive layer
24a: first rectangular part
24b: second rectangular part
25: third conductive layer
26: fourth conductive layer
30: gate electrode
40: first junction part
41: second junction part
42: connection part
50: insulating plate
51: gate wiring layer
52: source wiring layer
60: first insulating plate
61: gate wiring layer
62: second insulating layer
63: source wiring layer
64: notch
F1: current path
F2: current path
G1: first gate wire (another gate wiring member)
G2: second gate wire (gate wiring member)
G3: third gate wire
R: jointing material
S1: first source wire (another source wiring member)
S2: second source wire (source wiring member)

What is claimed is:

1. A semiconductor module, comprising:
an insulating substrate having an upper surface, and having a main wiring layer though which a main current of the semiconductor module flows, the main wiring layer being formed on the upper surface of the insulating substrate;
a first external terminal and a second external terminal adjacently arranged along a line extending in a first direction;
a plurality of semiconductor elements forming a first column and a plurality of semiconductor elements forming a second column, the first and second columns each extending in the first direction, the plurality of semiconductor elements in the first column being electrically connected in parallel to the other plurality of semiconductor elements in the second column, each semiconductor element in the first and second columns having an upper surface, and having a gate electrode and a source electrode on the upper surface thereof, and being disposed on the main wiring layer such that the gate electrodes of the semiconductor elements in the first column and the gate electrodes of the semiconductor elements in the second column face each other in a second direction orthogonal to the first direction;
a control wiring substrate through which a control current for controlling the semiconductor elements flows, the control wiring substrate being disposed between the first column and the second column and having a gate wiring layer and a source wiring layer each extending in the first direction;
a gate wiring member connecting one of the gate electrodes in the first column and one of the gate electrodes in the second column through the gate wiring layer; and
a source wiring member connecting one of the source electrodes in the first column and one of the source electrode in the second column through the source wiring layer.

2. The semiconductor module according to claim 1, wherein the control wiring substrate is disposed such that the gate wiring layer and the source wiring layer each extends in a direction orthogonal to a direction of the main current flowing through the main wiring layer.

3. The semiconductor module according to claim 1, wherein the control wiring substrate has an insulating plate on which the gate wiring layer and the source wiring layer are disposed.

4. The semiconductor module according to claim 1, wherein at least one of the gate wiring member or the source wiring member extends in a direction that is tilted with respect to a direction orthogonal to the direction of a main current flowing through the main wiring layer and is parallel to the upper surface of the insulating substrate.

5. The semiconductor module according to claim 1, wherein the control wiring substrate has an insulating plate and the gate wiring layer is a first gate wiring layer, and further includes a second gate wiring layer, the first gate wiring layer and the second gate wiring layer extending in parallel to each other, the source wiring layer being disposed between the first and second gate wiring layers.

6. The semiconductor module according to claim 1, wherein the control wiring substrate is configured by a multilayer board including an insulating layer, the multilayer board being multi-layered by sandwiching the insulating layer between the gate wiring layer and the source wiring layer.

7. The semiconductor module according to claim 1, further comprising:
a metallic wiring board electrically connecting the source electrodes of the semiconductor elements in the first and second columns and the main wiring layer, wherein
an upper surface of each of the gate wiring member and the source wiring member is positioned lower than a position of an upper surface of the metallic wiring board when viewed from a direction parallel to the upper surface of the insulating substrate.

8. The semiconductor module according to claim 1, further comprising:
a gate terminal and a source terminal provided at one side of one of opposite ends in the second direction of the control wiring substrate;
another gate wiring member connecting the gate terminal and an end of the gate wiring layer at the one side of the control wiring substrate; and
another source wiring member connecting the source terminal and an end of the source wiring layer at the one side of the control wiring substrate.

9. The semiconductor module according to claim 1, wherein
one of the plurality of semiconductor elements in the first column and one of the other plurality of semiconductor elements in the second column form an upper arm and another one of the plurality of semiconductor elements in the first column and another one of the other plurality of semiconductor elements in the second column form a lower arm, each semiconductor element in the upper arm and the lower arm having a lower-surface electrode, the main wiring layer has
a first conductive layer to which the lower-surface electrode of each semiconductor element in the upper arm is conductively connected; and
a second conductive layer to which the lower-surface electrode of each semiconductor element in the lower arm is conductively connected, the first external terminal is a positive terminal having a positive electrode end connected to the first conductive layer, the second external terminal is a negative terminal having at least one and an other branched negative electrode ends, and the positive electrode terminal is disposed between the one and the other negative electrode ends of the second external terminal.

10. The semiconductor module according to claim 9, wherein
the semiconductor elements in the upper arm are respectively disposed to be symmetric with the semiconductor element in the lower arm with respect to a center of the insulating substrate in a plan view of the semiconductor module, and
the semiconductor elements in the lower arm are disposed closer to a center line passing through the center of the insulating substrate in a direction parallel to the second direction in the plan view than are the semiconductor elements in the upper arm.

* * * * *